United States Patent

Iijima et al.

[15] 3,693,108

[45] Sept. 19, 1972

[54] SEMI-BALANCED AMPLIFIER

[72] Inventors: Nobuaki Iijima; Tohru Takahashi, both of Tokyo, Japan

[73] Assignee: Iwatsu Electric Co., Ltd., Tokyo, Japan

[22] Filed: Dec. 10, 1970

[21] Appl. No.: 96,841

Related U.S. Application Data

[63] Continuation-in-part of Ser. No. 790,751, Jan. 13, 1969, abandoned.

[30] Foreign Application Priority Data

Jan. 26, 1968 Japan....................43/4259

[52] U.S. Cl..................330/21, 330/30 R, 330/30 D, 330/94, 330/126

[51] Int. Cl................................................H03f 3/68

[58] Field of Search........330/20, 21, 35 D, 35 R, 69, 330/94, 126

[56] References Cited

UNITED STATES PATENTS 3,401,351 9/1968 Ellestad...............330/30 D X

*Primary Examiner*—Roy Lake
*Assistant Examiner*—James B. Mullins
*Attorney*—Woodcock, Washburn, Kurtz & Mackiewicz

[57] ABSTRACT

This invention relates to a semi-balanced amplifier which is able to reduce drift by the parallel connection of two amplifying elements such as transistors, vacuum tubes, etc. to a power source and thus amplifying, by means of said amplifying elements, a pair of input signals applied to each of input terminals of the respective amplifying elements.

29 Claims, 17 Drawing Figures

FIG. 8
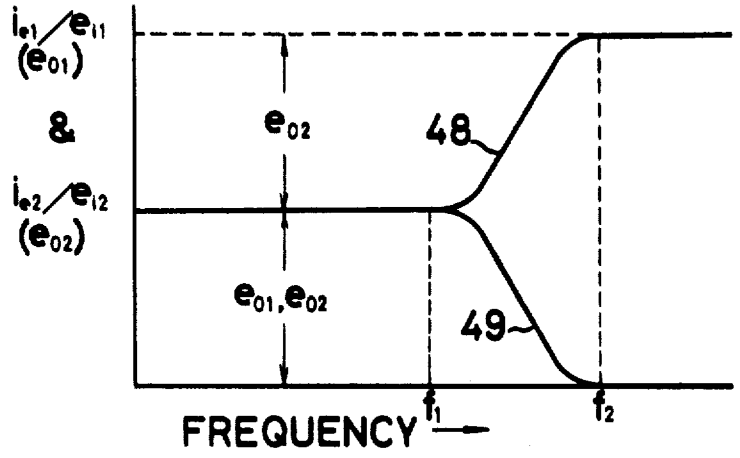
FIG. 9 FIG. 10
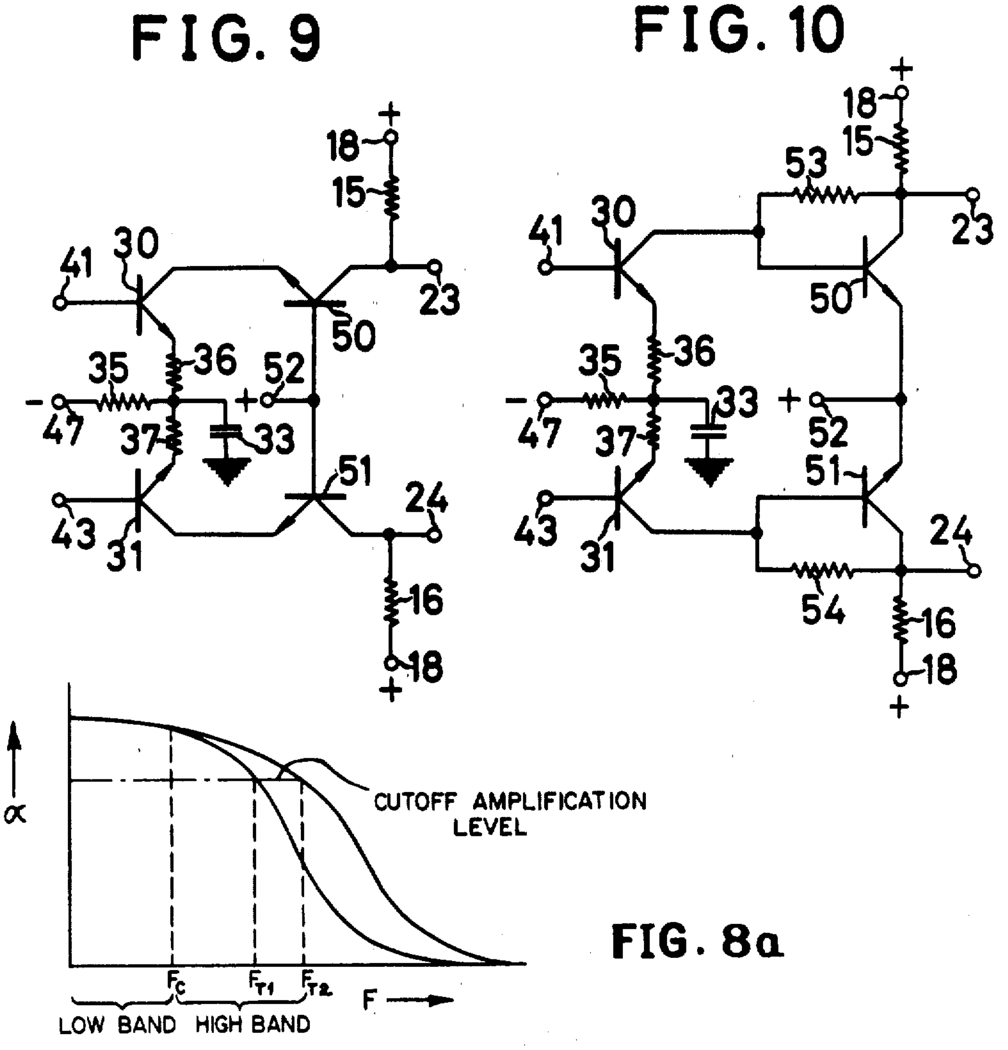
FIG. 8a

SEMI-BALANCED AMPLIFIER

This application is a continuation-in-part of our application Ser. No. 790,751 filed Jan. 13, 1969 now abandoned.

In one type of balanced amplifier or differential amplifier practiced in the prior art, which is a direct-coupled D.C. amplifier, the emitters of the two transistors are respectively connected to a common bias resistance. The common bias resistance is connected to one source terminal through an emitter resistance connected in parallel with a variable capacitance with respective collectors of the transistors connected to the other source terminal through respective load resistances. By apply input signals to the respective bases of the transistors, which have substantially identical parameters, output signals are derived from the collector potentials of the transistors. The bias resistances serve to achieve a constant-current circuit and the capacitance serves the purpose of improving the high frequency characteristics.

The balanced amplifier of the above mentioned type is characterized by:

a. minimizing drift and source noise due to the suppression of in-phase signals;

b. making direct-coupled multistage connection easy; and c. having phase-separating action that enables output signals of reciprocal phases to be obtained at the output terminals.

Consequently, the amplifier is applied for wide uses by taking advantage of these characteristics, and is also essential for driving the so-called CRT or the cathode-ray tube of an oscilloscope.

In such a balanced amplifier of the prior art, where compensation for a high frequency band by the capacitance cannot be fully assured, expensive high frequency amplifying elements with sufficient characteristics must be used in order to maintain good frequency characteristics even for high frequency. The prior art amplifiers also display an instability causing oscillation.

BRIEF SUMMARY OF THE INVENTION

An object of this invention is to provide an amplifier which is able to secure desired frequency characteristics stably and easily even in high frequency.

Another object of this invention is to provide an improved amplifier which causes less drift and is resistant to source noise because of its action to suppress in-phase signals.

A further object of this invention is to provide an improved amplifier which makes direct-coupled multistage connection easy.

A still further object of this invention is to provide an improved amplifier which has phase-separating action to enable output signals of reciprocal phases to be obtained at output terminals.

Still another object of this invention is to provide an amplifier which is stable against oscillation.

An additional object of this invention is to provide an amplifier which has a simple circuit composition and makes wiring easy.

A further additional object of this invention is to provide an amplifier which is suitable for the vertical deflection amplifier of an oscilloscope.

In accordance with an aspect of this invention, two amplifying elements having different electrical parameters are connected in parallel to a power source, and a circuit element or network of the predetermined frequency characteristics is connected from junction of the common electrodes of said amplifying elements and ground or circuit common.

The above and other objects, features and advantages of this invention will become apparent from the following detailed description of illustrative embodiments shown in the accompanying drawings.

BRIEF DESCRIPTION OF THE DRAWINGS

FIG. 8 is a characteristics diagram to explain the operation of the amplifier shown in FIG. 2;

FIG. 8*a* displays amplication-frequency characteristics for two different transistors;

FIGS. 9 and 10 are the circuit diagrams of other embodiments of an amplifier in accordance with this invention.

DESCRIPTION OF PREFERRED EMBODIMENTS

Figure 1:
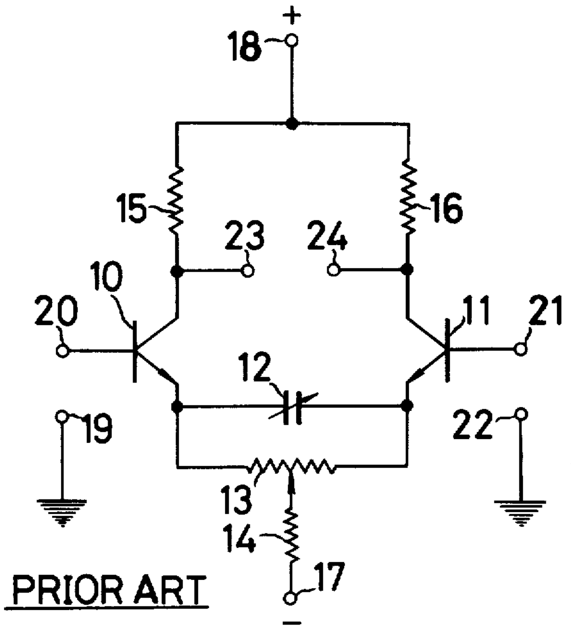
FIG. 1 is a circuit diagram showing a balanced amplifier practiced in the prior art.

FIG. 1 shows an illustrative circuit diagram of a balanced amplifier or differential amplifier practiced in the prior art. The emitters of two transistors 10 and 11 are connected respectively to common bias resistance 14, which is in turn connected to one power source terminal 17, through emitter resistor 13. A variable capacitance 12 is connected in parallel with the emitter resistor 13. The collectors of the transistors 10 and 11 are connected to the other power source terminal 18 through respective load resistances 15 and 16.

A bias resistance 14 is for the purpose of providing a constant-current circuit. Transistors 10 and 11 have a substantially identical electrical parameters. The capacitance 12 is for the purpose of improving high frequency characteristics.

In the balanced amplifier shown in FIG. 1, when an input signal is applied to the base of transistor 10 through input terminals 19 and 20 of one group and simultaneously to the base of transistor 11 through input terminals 21 and 22 of the other group, respectively, an output signal, which consists of the collector potentials of transistors 10 and 11, is obtained from output terminals 23 and 24.

Such a balanced amplifier has the aforementioned characteristics *a*, *b* and *c*. However, because compensation for a high frequency band by capacitance cannot be fully assured, expensive high frequency amplifying elements with sufficient characteristics must be used in order to maintain good frequency characteristics even for high frequency operation. Moreover, the inherent instability of such a balanced amplifier can cause oscillation.

In view of the foregoing, the amplifier in accordance with this invention is one in which a circuit element or frequency dependent network with predetermined frequency characteristics is connected from the connection between the common electrodes of the amplifying elements and ground or circuit common.

Figure 2:
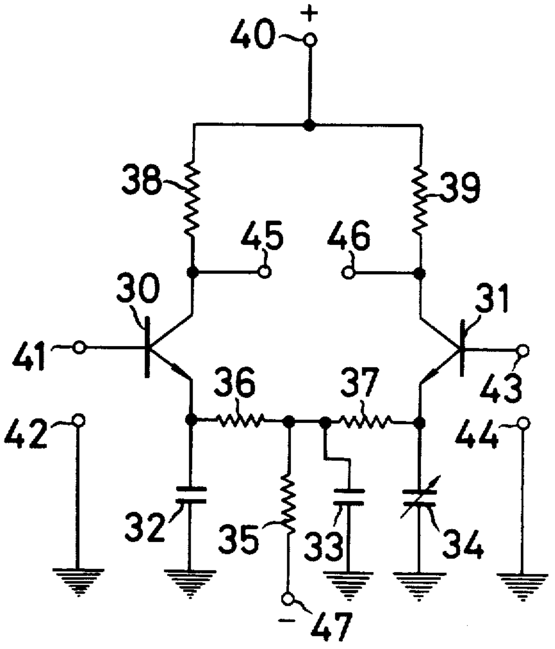
FIG. 2 is a circuit diagram of one embodiment of an amplifier in accordance with this invention.

Referring to FIG. 2 which shows a circuit diagram of one embodiment of an amplifier is accordance with this invention, the emitters of two transistors 30 and 31 respectively are connected to common bias resistance 35, which is connected to one power source terminal 47, through a connection including emitter resistors 36 and 37. A by-pass capacitance 33 for high frequency components is connected from the junction of resistors 36 and 37, to which bias resistance 35 is connected and ground.

The value of this capacitance 33 is chosen so that cross-over frequency, determined primarily by capacitance 33 and resistors 36 and 37, will be lower than the cut-off frequency for the grounded emitter amplifier in which the transistor having the lower frequency capability of the two transistors 30 and 31 is acting and in which resistors 36 and 37 are used as feedback resistance. And it is desirable if the cross-over frequency is less than about four-fifths of said cut-off frequency, and more desirable if less than about two-thirds. In addition, however small the former may be as compared to the latter, it is preferable if the former is larger than about 1/10,000 of the latter, and further preferable if larger than about 1/1,000 in order not to reduce suppression of in-phase signals and for other reasons. The above mentioned limitation on the value of capacitance 33, that is, the limitation on the relationship between the cross-over frequency and the cut-off frequency is also applicable if the by-pass capacitance 33 is replaced by another circuit element or network.

In addition, capacitance 32 and variable capacitance 34 for obtaining peaking characteristics, respectively, are connected between the emitters of transistors 30 and 31 and ground. The collector sides of transistors 30 and 31 are connected to the other power source terminal 40 through respective load resistances 38 and 39. Bias resistance 35 is for the purpose of providing a constant-current circuit. Transistors 30 and 31 may have an almost identical electrical parameter as each other.

In the amplifier shown in FIG. 2, when an input signal is applied to the base of transistor 30 through the input terminals 41 and 42 of one group and simultaneously to the base of transistor 31 through the input terminals 43 and 44 of the other group, respectively, an output signal, which consists of the collector potentials of transistors 30 and 31, is obtained at output terminals 45 and 46.

The following is a description about differences in action and characteristics between the circuit of FIG. 2 in accordance with this invention and the circuit of FIG. 1 practiced in the prior art.

In the first place, in regard to the balanced amplifier or differential amplifier, let us obtain its high frequency characteristics by utilizing the equivalent circuit for high frequency. For simplication, suppose that input is only applied to input terminals 19 and 20 of one group, and that the input terminals 21 and 22 of the other group are grounded. Although at high frequencies the effects of the capacitance producing the Miller effect, the base-collector capacitance of transistors 10 and 11, ought to be taken into consideration, the effects of the capacitance producing the Miller effect are herein disregarded for the sake of simplicity since the Miller effect is substantially identical for both circuits. The comparative values of high frequency characteristics are obtained in the form of mutual conductance or transconductance $i_o/V_i$.

Figure 3:
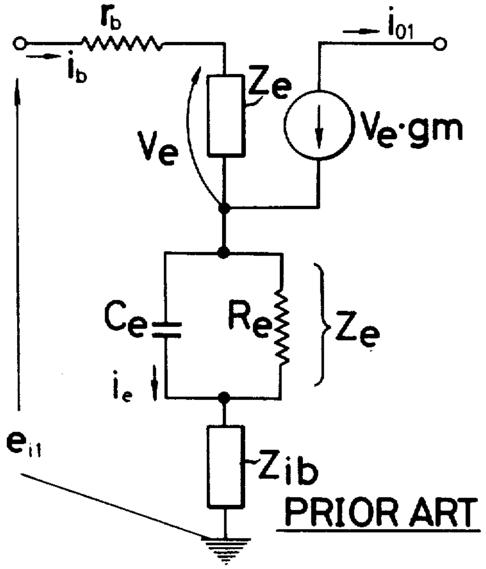
FIGS. 3 and 4 are the equivalent circuit diagrams of the circuit shown in FIG. 1.

Thus, the equivalent circuit on the side of transistor 10 of the balanced amplifier shown in FIG. 1 becomes one shown in FIG. 3. However, $C_e$ represents the capacitance value of capacitance 12, $R_e$ means the resistance value of resistance 13, and the equivalent circuit constant of FIG. 3 is established in the case that it exists within a frequency band, providing:

$$\beta_0 \gg \beta\omega$$

Each constant is as follows:

Π

$$z_e = \frac{\omega_T r_e}{j\omega} = \frac{\gamma_e}{S\tau_T}$$

$$gm = \frac{1}{r_e} \quad Z_e = \frac{R_e}{1+S\tau_T} \quad \beta = \frac{1}{S\tau_T}$$

$$Z_{ib} = \frac{S \cdot r_b \tau_T}{1+S\tau_T}$$

$$\tau_T = 1/\Omega_T$$

Obtaining the mutual conductance or trans-conductance $i_{ol}/e_{il}$ of transistor 10 based on FIG. 3, $$i_{01}/e_{i1} = \frac{1}{(R_e+r_e)\left(1+j\frac{\omega}{\omega_{c1}}\right)} \quad (1)$$

providing $$\omega_{c1} = \omega_T \frac{R_e+r_e}{2r_b}$$

In other words, the smaller $r_b$ and the larger the resistance value $R_e$ of emitter resistance are, the higher the cut-off frequency becomes.

Figures 4, 5, 6, 7:
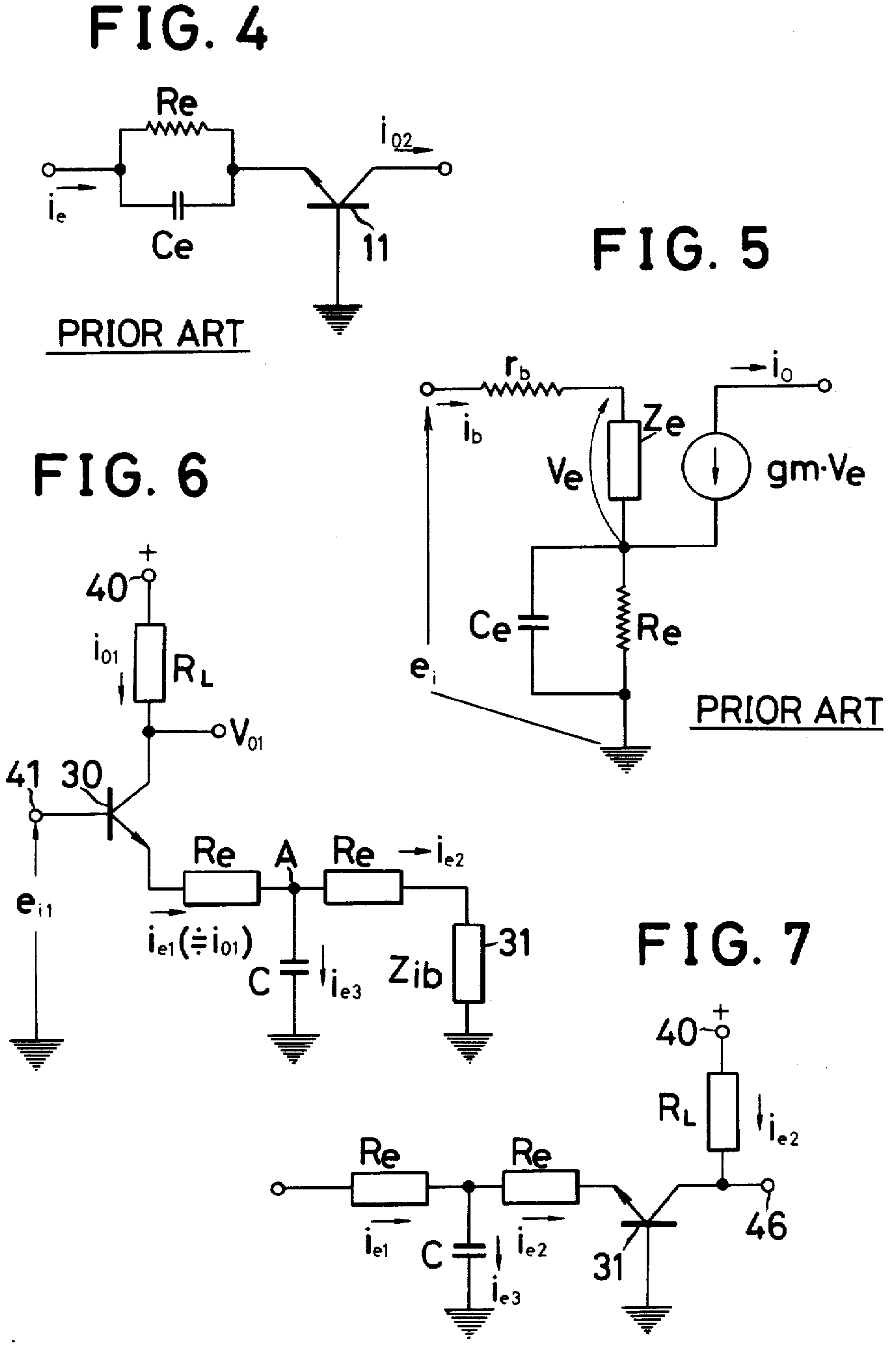
FIG. 5 is an equivalent circuit diagram of an emitter-series circuit feedback amplifier practiced in the prior art.
FIGS. 6 and 7 are the equivalent circuit diagrams of the circuit shown in FIG. 2.

The equivalent circuit on the side of transistor 11 of the balanced amplifier shown in FIG. 1 then becomes one shown in FIG. 4, wherein:

$$i_e = \beta \cdot i_b$$

$$i_{02} = \alpha_{ie} = \frac{S\tau_T}{1+S\tau_T} \cdot i_e$$

obtaining the mutual conductance or transconductance $i_{o2}/e_{i1}$ of transistor 11 from FIGS. 3 and 4, $$i_{02}/e_{i1} = \frac{1}{(R_c+r_e)\left(1+j\frac{\omega}{\omega_{c2}}\right)} \quad (2)$$

providing $$\omega_{c2} = \omega_T \frac{R_e+r_e}{2r_b} = \omega_{c1}$$

The above formula (2) becomes same as the formula (1). Therefore, the output of transistor 11 are of the same characteristics as the output of transistor 10 and also is of reverse polarity.

The cut-off frequency $\omega_c$ of the mutual conductance or transconductance at this moment is $$\omega_c = \omega_T R_e + R_e /2R_b \quad (3)$$

In the second, obtaining the mutual conductance or transconductance $i_o/e_i$ of one stage of the emitter-series circuit feedback amplifier practiced in the prior art and showing an equivalent circuit for high frequency in FIG. 5, in order to facilitate the subsequent explanation, $$i_0/e_i = \frac{1}{(R_e + r_e)\left(1 + j\frac{\omega}{\omega'_c}\right)} \quad (4)$$

providing $$\omega'_c = \omega_T \frac{R_e/2 + r_e}{r_b}$$

Comparing the cut-off frequencies of this E–G type amplifier and the balanced amplifier of FIG. 1 on the basis of the formulas (1), (2), (3) and (4), it is obvious that so far as the external constant is concerned, the cut-off frequency of the E-G type amplifier is two times higher than the balanced amplifier shown in FIG. 1. In the case of the balanced amplifier, the output has twice as much as gain as the E-G type amplifier.

From the cut-off frequency formulas (2), (3) and (4), if $$R_e >> r_e$$

it will be apparent that the cut-off frequency becomes the same as that of the balanced amplifier even by making $R_e$ half and doubling the conductance in the case of the E-G type amplifier. That is to say, one stage of the E-G type amplifier and one stage of the balanced amplifier become equal in terms of the gain-band width product or G-B product, and this the E-G type amplifier is economically superior by two times.

In the above mentioned equivalent circuit, the collector capacitance of the transistor was neglected for the sake of simplicity, but there is in fact a big decrease in the cut-off frequency due to parasitic capacitance, etc. including the collector capacitance, emitter compensation capacitance 12 or $C_e$ being used in a large value with the following condition:

$$C_e R_e = \tau_T$$

(providing that $C_e$ is the capacitance value of the capacitance 12)

As clearly understood from FIGS. 3 and 5, the E-G type amplifier is superior in terms of peaking effect due to the capacitance 12 or $C_e$, that is, compensation for a high frenquency band is easy. Thus, as a high frequency amplifier the E-G type amplifier is superior to the balanced amplifier in terms of economy and efficiency.

Thirdly, the action and characteristics of the amplifier of FIG. 2 in accordance with this invention will be explained. Like the above explanation, considering the case of single input for the sake of simplicity, the equivalent circuit on the side of transistor 30 is as shown in FIG. 6, wherein C represents the capacitance value of capacitance 33 $R_L$ the resistance value of resistance 38, and $R_e$ the resistance value of resistances 36 and 37, respectively. In this case, suppose $$i_{e1} = i_{e2} + i_{e3}$$
$$R_e >> Z_{ib}.$$

Since the capacitance value C of the capacitance 33 can be ignored in a low frequency band, $i_{i1} = i_{e2}$, and transistors 30 and 31 are driven as a normal balanced amplifier. Next, in such a high frequency band that capacitance 33 in fact ground point A, $i_{e1} = i_{e3}$ , and there is no current toward the side of transistor 31. Transistor 30 is then driven as an E-G type amplifier having a feedback resistance $R_e$, and at output terminal 45 is gained the output $V_{o1}$ which is double as large as in the case of low frequency. And there appears no output on the side of transistor 31. In other words, mutual conductance or transconductance $i_{o1}/e_{i1}$ in high frequency becomes twice as large as in low frequency. This increase in mutual conductance is directly proportional to an increase in current $i_{e3}$ into capacitance C, and inversely proportional to a decrease in current $i_{e2}$.

In an intermediate frequency band, current $i_{e1}$ is shunted into current $i_{e2}$ and current $i_{e3}$ and the components of current $i_{e3}$ increase as the frequency rises, output $V_{o1}$ thus being smoothly shifted between the case of low frequency and high frequency.

The equivalent circuit on the side of transistor 31 is as shown in FIG. 7. Because transistor 31 therein is driven as a grounded base amplifier, driving current $i_{e2}$ alone may be paid attention, and as apparent from the above explanation, the output of transistor 31 is obtained only in a low frequency band. Because the current amplification factor of grounded base equals approximately 1 (one), the mutual conductance or transconductance $i_{o2}/e_{i1}$ of transistor 31 is equal to that of transistor 30 in a low frequency band, and diminishes toward 0 (zero) as frequency increases. It will be apparent from the explanation so far that the rate of this diminution, that is, the rate of variation is in a completely complementary relationship with the rate of increase in the mutual conductance of transistor 30. Such a relationship is shown in FIG. 8, wherein curve 48 is regarding transistor 30, and curve 49 is concerned with transistor 31. Corner frequencies $f_1$ and $f_2$ are determined by $R_e$, $C$, $Z_{ib}$, etc. and are approximately in the relationship $f_2 = 2f_1$.

Consequently, the amplifier in accordance with this invention is driven as a normal balanced amplifier in a low frequency band which is lower than $f_1$. In a high frequency band, only one transistor is driven under an unbalanced condition as a grounded emitter amplifier. However, it will be obvious from the above explanation that if balanced output $e_{o1} - e_{o2}$ is used, frequency characteristics become plain ones irrespective of balancing or non-balancing action. The amplifier in accordance with this invention is therefore an amplifier to be called a semi-balanced amplifier. In addition, this semi-balanced amplifier itself has several advantages of a balanced amplifier. These advantages contain avoidance of drift, action to suppress in-phase signals, easiness of direct-coupled multistage connection, etc. Considering high frequency characteristics, the semi-balanced amplifier emitter feedback resistance 36 represents one half of that in a balanced amplifier. Under this condition, the cut-off frequency of the E-G type amplifier is still not less than that of the balanced amplifier. In addition there is an advantage that it is easy to compensate for a high frequency band.

Furthermore, in the semi-balanced amplifier in accordance with this invention, either transistor 30 or 31 may be an inexpensive transistor having a lower cut-off frequency $f_{T1}$ than the other transistor used, where the other transistor having the higher cut-off frequency $f_{T2}$ performs the role of amplifying the high frequency band as shown in FIG. 8a. In other words, two transistors 30 and 31 may be different transistors with different frequency $f$-amplification 2 characteristics. In this case, cut-off frequency $f_T$ of one or transistors 30 or 31 may be high enough to adequately amplify frequency components lower than the cross-over frequency that is determined by a time constant decided by emitter resistors 36 and 37 and bypass capacitance 33. Note that the cut-off frequency does not mean that application no longer occurs at higher frequencies but that application has dropped a certain amount, e.g., 3db. With an inexpensive transistor used as either transistor, this invention therefore leads to an inexpensive amplifier which is notably economical and of high efficiency as well. Also in this case, the value of bypass capacitance 33 should be charged with same limitation as that previously referred to.

Thus, in the semi-balanced amplifier in accordance with this invention, amplification of a high frequency band is carried by one transistor 30 only. It therefore has an excellent economic advantage in that there is no need for an expensive high frequency transistor to be applied particularly for the other transistor 31, and it has an additional advantage that there is no particular restraint on high frequency in the wiring of transistor 31.

In the aforementioned explanation about the action of the semi-balanced amplifier in accordance with this invention, input represents single input, but quite the same action will result even if input is balanced input or differential input. In this case, however, transistor 30 engages in high frequency amplification if input $e_{i1}$ from input terminals 41 and 42, and transistor 31 engages in amplification of the high frequency components of input $e_{i2}$ from input terminals 43 and 44.

A combined circuit between the semi-balanced amplifier in accordance with this invention and the grounded base amplifier is shown in FIG. 9. This circuit is same as the amplifier shown in FIG. 2 except that transistors 50 and 51 are provided and that resistance 35 and capacitances 32 and 34 are omitted. And the emitters of said transistors 50 and 51 are connected to the collectors of transistors 30 and 31, the collectors of said transistors 50 and 51 being respectively connected to output terminals 23 and 24 and resistances 15 and 16. The bases of transistors 50 and 51 are connected to common power source terminal 52. In addition, identical reference numbers are applied to these portions common to FIG. 2.

In the circuit shown in FIG. 9, because the grounded base amplifier comprising transistors 50 and 51 is driven as a current amplifier, the output characteristics of transistors 30 and 31 are just maintained, and these outputs, becoming the respective outputs of transistors 50 and 51, are taken out of output terminals 23 and 24. Consequently, the circuit shown in FIG. 9 can be considered as a mixture-type semi-balanced amplifier from an overall viewpoint.

A combined circuit between the semi-balanced amplifier in accordance with this invention and a shunt feedback amplifier is shown in FIG. 10. In this circuit, the connections of the bases and emitters of transistors 50 and 51 are reversed with respect to the circuit of FIG. 9, and resistances 53 and 54 are provided between the bases and the collectors. In addition, identical reference numbers are applied to those portions common to FIG. 9.

In the circuit shown in FIG. 10, because the feedback amplifier comprising transistors 50 and 51 is driven as a current amplifier, the output characteristics of transistors 30 and 31 are just maintained, and these outputs, becoming the respective outputs of transistors 50 and 51, are taken out of output terminals 23 and 24. Consequently, the circuit shown in FIG. 10 can also be considered as a mixture-type semi-balanced amplifier from an overall viewpoint.

The following is a description about a multistage amplifier as an applied case of the semi-balanced amplifier in accordance with this invention.

Figure 11:
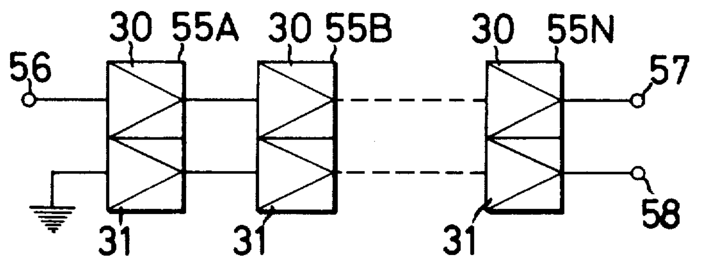
FIGS. 11–13 are respectively the block diagrams of embodiments applying the amplifier in accordance with this invention to a multistage amplifier.

In FIG. 11, $n$-stage cascade connection of the semi-balanced amplifiers 55A, 55B–55N in accordance with this invention is made. An input signal from input terminal 56 is phase-separated only in a low band at the first-stage amplifier 55A, and lower element 31 of this amplifier 55A makes no high band amplification. Additionally, since input signals are likewise treated at the stages from the second-stage amplifier 55B up to the final $n$-stage amplifier 55N, semi-balanced outputs are obtained at output terminals 57 and 58. In other words, at each of amplifiers 55A, 55B–55N, upper element 30 principally engages in amplification of a high frequency band, and lower element 31 mainly engages in lower frequency amplification.

Furthermore, in the case where the outputs of output terminals 57 and 58 are used as balanced output, high frequency characteristics become plain from a low frequency band up to a high frequency band. The cross-over frequency of the outputs of output terminals 57 and 58 is determined by the time constant of the final-stage or $n$-stage amplifier.

In the composition of FIG. 11, since lower element or lower transistor 31 engages only in low frequency amplification, it has no need for use of an expensive high frequency transistor, and is therefore economical. In addition, because compensation for high frequency characteristics can be made easily by means of the multistage connection of the grounded emitter amplifiers of lower transistors 30 alone, there is no danger of high frequency oscillation which arises in the balanced amplifier.

Figure 12:
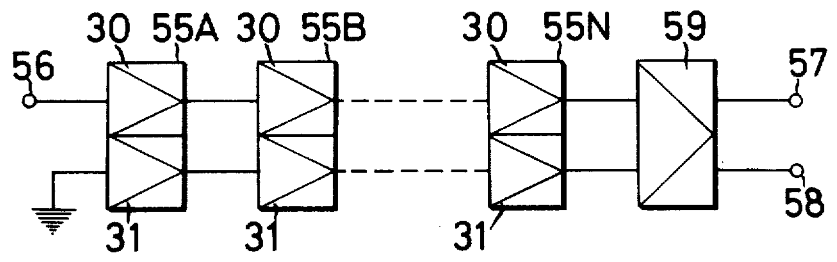

As for FIG. 12, in the multistage amplifier shown in FIG. 11 an ordinary balanced amplifier as shown in FIG. 1 is cascade-connected to the back of the $n$-stage semi-balanced amplifier 55$N$, that is, the final stage, and identical reference numbers are applied to those portions common to FIG. 11. Since this causes non-balanced signals to be converted into balanced signals by means of balanced amplifier 59, outputs from output terminals 57 and 58 result in complete balanced outputs, and said multistage amplifier thus becomes suitable for the deflection circuit of a cathode-ray tube.

Figure 13:
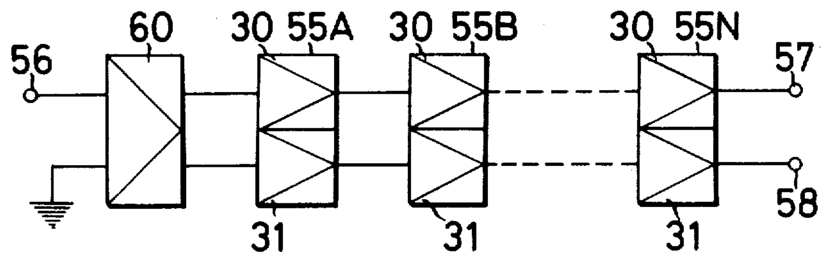

FIG. 13 is showing that in the amplifier shown in FIG. 11 an ordinary balanced amplifier 60 as shown in FIG. 1 is cascade-connected to the front of the 1st-stage semebalancing amplifier 55A, that is, the front stage, and identical reference numbers are therein applied to those portions common to FIG. 11. This causes input signals to be phase-separated and converted into balanced signals at the first-stage balanced amplifier, and to drive the semi-balanced amplifiers of the stages from the second up to the last. In this case, the semi-balanced amplifiers 55A, 55B–55N are driven as if they were ordinary balanced amplifiers, and balanceed signals are obtained at output terminals 57 and 58. In each of the semi-balanced amplifiers, however, transistors 30 and 31, which are corresponding to each other are driven independently in terms of high frequency, maintaining the advantages of the semi-balanced amplifier such as easiness in compensation for high frequency, stability against oscillation.

In addition to the multistage amplifiers shown in FIGS. 11 - 13, various combinations between the semi-balanced amplifier in accordance with this invention and an ordinary single-stage amplifier can be considered.

Furthermore, as the external resistances of the emitter in the semi-balanced amplifier in accordance with this invention, it is also possible to use the emitter resistance of transistor itself. In addition, it is possible to obtain a semi-balanced amplifier using transistors 30 and 31 having a unbalanced additional constant.

Although parallel-connected amplifying elements comprising transistors have been described, electronic tubes or equivalent device may be employed.

Figure 2A:
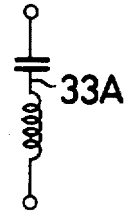
FIGS. 2*a*–2*c* are diagrams of circuit modifications for FIG. 2.
Figure 2B:
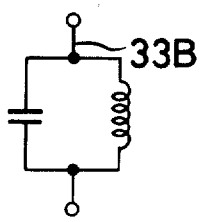
Figure 2C:
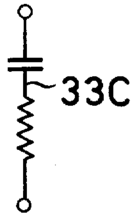

A further explanation has been made about the case in which capacitance 33 is connected to the central point of the combined resistance comprising resistances 36 and 37, thus securing the improvement of high-frequency band characteristice. But if instead of capacitance C, a circuit network of desired high frequency characteristics comprising capacitance C and inductive element L or resistive element R (such as a series or parallel resonant, circuit 33A or 33B as shown in FIGS. 2*a* and 2*b* by means of inductive element L and capacitance C; a series circuit 33C as shown in FIG. 2*c* by means of resistive element R and capacitance C; and other filter circuits in general) is used, two unbalanced outputs, which are complementary to each other copying with the high-frequency characteristics of said circuit network, can be obtained. This action can be called band-separating action.

Although the illustrative embodiment of this invention have been described in detail above with reference to the accompanying drawings, it is to be understood that this invention is not limited to those precise embodiments, and that various changes and modifications may be effected therein by one skilled in the art without departing from the scope or spirit of the invention.

What is claimed is:

1. A semi-balanced amplifier comprising
   a pair of parallel connected amplifying elements having input terminals, output terminals, and interconnected terminals, both of said amplifying elements having substantially comparable characteristics within one frequency range and one of said amplifying elements having substantially superior characteristics within another frequency range
   power supply means connected to said output terminals and said interconnected terminals to appropriately bias said amplifying elements: and
   a common filter network connecting the interconnection of said interconnected terminals to circuit common frequency components within said one frequency range being passed between said interconnected terminals while frequency components within said other frequency range are blocked by said filter network, said filter network thereby permitting frequency components within said one frequency range to be amplified by both amplifying elements so as to obtain balanced phase-separated output signals from said output terminals for frequency components within said one frequency range while permitting frequency components within said other frequency range to be exclusively amplified by said amplifying element having superior frequency characteristics to obtain unbalanced output signals without phase separation from said output terminals for frequency components within said other frequency range.

2. The semi-balanced amplifier according to claim 1 wherein said amplifying elements respectively are transistors.

3. The semi-balanced amplifier according to claim 2 wherein said interconnected terminals of said transistors respectively are emitters.

4. The semi-balanced amplifier according to claim 1 wherein said filter network is capacitive.

5. The semi-balanced amplifier according to claim 1 wherein said filter network comprises a series resonant circuit including an inductive element and a capacitive element.

6. The semi-balanced amplifier according to claim 1 wherein said filter network comprises a parallel resonant circuit including an inductive element and a capacitive element.

7. The semi-balanced amplifier according to claim 1 wherein said filter network comprises a series circuit including a resistive element and a capacitive element.

8. The semi-balanced amplifier according to claim 3 wherein said interconnection between said interconnected terminals comprises a pair of series connected emitter resistors with an intermediate junction connected to said filter network.

9. The semi-balanced amplifier according to claim 8 wherein one power supply means terminal is connected to said intermediate junction.

10. The semi-balanced amplifier according to claim 8 wherein said network is capacitive element, and the value of said capacitive element is chosen so that cross-over frequency determined primarily by said capacitive element and said emitter resistors will be lower than cut-off frequency for the grounded emitter amplifier in which one amplifying element with lower frequency capability between said amplifying elements is acting and in which said emitter resistors are used as feedback resistance.

11. The semi-balanced amplifier according to claim 10 wherein said cross-over frequency is less than about four-fifths of said cut-off frequency.

12. The semi-balanced amplifier according to claim 10 wherein said cross-over frequency is less than about two-thirds of said cut-off frequency.

13. The semi-balanced amplifier according to claim 9 wherein one of another pair of transistors is connected to the output terminal of one of said amplifying elements and the other of said other pair of transistors is connected to the output terminal of the other of said amplifying elements, the emitters of said other pair of transistors respectively connected to the output terminals of said amplifying elements, the bases of said other pair of transistors respectively connected to the other power supply means terminal, and the collectors of said other pair of transistors serving as output terminals for said amplifier.

14. The semi-balanced amplifier according to claim 12 wherein one of another pair of transistors is connected to the output terminal of one of said amplifying elements and the other of said other pair of transistors is connected to the output terminal of the other of said amplifying elements, the bases of said other pair of transistors respectively connected to the output terminals of said amplifying elements, the emitters of said other pair of transistors respectively connected to the other power supply means terminal, the collectors of said other pair of transistors serving as output terminals for said amplifier, and a pair of resistance means respectively connected between the bases and collectors of said other pair of transistors.

15. A multi-stage amplifier having cascade-connected semi-balanced amplifiers with a pair of output terminals of one of said amplifiers respectively connected to a pair of input terminals of the other of said amplifiers, each of said semi-balanced amplifiers comprising a pair of parallel connected amplifying elements having input terminals, output terminals, and interconnected terminals, both of said amplifying elements having substantially comparable characteristics within one frequency range and one of said amplifying elements having substantially superior characteristics within another frequency range, power supply means connected to said output terminals and said interconnected terminals to appropriately bias said amplifying elements; and a common filter network connecting the interconnection of said interconnected terminals to circuit common, frequency components within said one frequency range being passed between said interconnected terminals while frequency components within said other frequency range are blocked by said filter network, said filter network thereby permitting frequency components within said one frequency range to be amplified by both amplifying elements so as to obtain balanced phase separated output signals from said output terminals for frequency components within said one frequency range while permitting frequency components within said other frequency range to be exclusively amplified by said amplifying element having superior frequency characteristics to obtain unbalanced output signals without phase separation from said output terminals for frequency components within said other frequency range.

16. A multi-stage amplifier according to claim 15 including a balanced amplifier cascade-connected to the last stage of said cascade-connected amplifiers.

17. A multi-stage amplifier according to claim 15 including a balanced amplifier cascade-connected to the first stage of said cascade-connected amplifiers.

18. A semi-balanced amplifier system comprising a source means of one input signal having frequency components in one frequency range and another input signal only having frequency components in another frequency range, said one frequency range being exclusive of said other frequency range, a pair of parallel connected amplifying elements having input terminals, output terminals, and interconnected terminals, power supply means connected to said output terminals and said interconnected terminals to appropriately bias said amplifying elements; and a frequency dependent impedance connecting said interconnected terminals to circuit common, frequency dependent network having a high impedance to circuit common over said one frequency range and a low impedance to circuit common over said other frequency range, frequency components within said one frequency range being passed between said interconnected terminals while frequency components within said other frequency range are shunted to ground by said frequency dependent impedance, a coupling means for coupling said one input signal to said input terminal of one of said amplifying elements and for coupling said other input signal to said input terminal of the other of said amplifying elements whereby frequency components within said other frequency range are exclusively amplified by said other of said amplifying elements to obtain unbalanced output signals for frequency components within said other frequency range.

19. The semi-balanced amplifier system according to claim 18 wherein said amplifying elements respectively are transistors.

20. The semi-balanced amplifier system according to claim 19 wherein said interconnected terminals of said transistors respectively are emitters.

21. The semi-balanced amplifier system according to claim 18 wherein said frequency dependent network is capacitive.

22. The semi-balanced amplifier system according to claim 18 wherein said frequency dependent impedance comprises a series resonant circuit including an inductive element and a capacitive element.

23. The semi-balanced amplifier system according to claim 18 wherein said frequency dependent impedance comprises a parallel resonant circuit including an inductive element and a capacitive element.

24. The semi-balanced amplifier system according to claim 23 wherein said interconnection between said interconnected terminals comprises a pair of series connected emitter resistors with an intermediate junction connected to said filter network.

25. The semi-balanced amplifier system according to claim 24 wherein one power supply means terminal is connected to said intermediate junction.

26. The semi-balanced amplifier system according to claim 25 wherein one of another pair of transistors is connected to the output terminal of one of said amplifying elements and the other of said other pair of transistors is connected to the output terminal of the other of said amplifying elements, the emitters of said other pair of transistors respectively connected to the output terminals of said amplifying elements, the bases of said other pair of transistors respectively connected to the other power source means terminal, and the collectors of said other pair of transistors serving as output terminals for said amplifier.

27. The semi-balanced amplifier system according to claim 25 wherein one of another pair of transistors is connected to the output terminal of one of said amplifying elements and the other of said other pair of transistors is connected to the output terminal of the other of said amplifying elements, the bases of said other pair of transistors respectively connected to the output terminals of said amplifying elements, the emitters of said other pair of transistors respectively connected to the other power supply means terminal, the collectors of said other pair of transistors serving as output terminals for said amplifier, and a pair of resistance means respectively connected between the bases and collectors of said other pair of transistors.

28. A multi-stage amplifier system comprising:

a source means of one input signal having frequency components in one frequency range and another input signal only having frequency components in another frequency range, said one frequency range being exclusive of said other frequency range, cascade-connected semi-balanced amplifiers with a pair of output terminals of one of said amplifiers respectively connected to a pair of input terminals of the other of said amplifiers, each of said semi-balanced amplifiers comprising a pair of parallel connected amplifying elements having input terminals, output terminals, and interconnected terminals, power supply means connected to said output terminals and said interconnected terminals to appropriately bias said amplifying elements; and a frequency dependent impedance connecting said interconnected terminals to circuit common, said frequency dependent network having a high impedance to circuit common over said one frequency range and a low impedance to circuit common over said other frequency range, frequency components within said one frequency range being passed between said interconnected terminals while frequency components within said other frequency range are shunted to ground by said frequency dependent impedance, a coupling means for coupling said one input signal to said input terminal of one of said amplifying elements and for coupling said other input signal to said input terminal of the other of said amplifying elements whereby frequency components within said other frequency range are exclusively amplified by said other of said amplifying elements to obtain unbalanced output signals for frequency components within said other frequency range.

29. A multi-stage amplifier system according to claim 28 including a balanced amplifier cascade-connected to the last stage of said cascade-connected amplifiers.

* * * * *